(12) United States Patent
Zhong et al.

(10) Patent No.: US 11,527,437 B2
(45) Date of Patent: Dec. 13, 2022

(54) METHODS AND APPARATUS FOR INTERMIXING LAYER FOR ENHANCED METAL REFLOW

(71) Applicant: APPLIED MATERIALS, INC., Santa Clara, CA (US)

(72) Inventors: Lanlan Zhong, Santa Clara, CA (US); Fuhong Zhang, San Jose, CA (US); Gang Shen, San Jose, CA (US); Feng Chen, San Jose, CA (US); Rui Li, San Jose, CA (US); Xiangjin Xie, Fremont, CA (US); Tae Hong Ha, San Jose, CA (US); Xianmin Tang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 79 days.

(21) Appl. No.: 17/022,058

(22) Filed: Sep. 15, 2020

(65) Prior Publication Data
US 2022/0084882 A1   Mar. 17, 2022

(51) Int. Cl.
*H01L 21/768* (2006.01)
*G11B 5/31* (2006.01)
*C23C 16/455* (2006.01)

(52) U.S. Cl.
CPC .. *H01L 21/76882* (2013.01); *C23C 16/45536* (2013.01); *G11B 5/313* (2013.01); *H01L 21/76871* (2013.01)

(58) Field of Classification Search
CPC ......... H01L 21/76882; H01L 21/76871; C23C 16/45536; G11B 5/313
See application file for complete search history.

(56) References Cited

U.S. PATENT DOCUMENTS

| | | |
|---|---|---|
| 6,541,860 B1 | 4/2003 | Woo et al. |
| 6,599,828 B1 | 7/2003 | Gardner |
| 6,727,176 B2 | 4/2004 | Ngo et al. |
| 2005/0006222 A1* | 1/2005 | Ding ............. C23C 14/35 204/192.12 |
| 2006/0118968 A1 | 6/2006 | Johnston et al. |
| 2009/0169760 A1 | 7/2009 | Akolkar et al. |

(Continued)

OTHER PUBLICATIONS

International Search Report and Written Opinion for PCT/US2021/050141 dated Jan. 3, 2022.

*Primary Examiner* — Julia Slutsker
(74) *Attorney, Agent, or Firm* — Moser Taboada

(57) ABSTRACT

Methods and apparatus for filling features on a substrate are provided herein. In some embodiments, a method of filling features on a substrate includes: depositing a first metallic material on the substrate and within a feature disposed in the substrate in a first process chamber via a chemical vapor deposition (CVD) process at a first temperature; depositing a second metallic material on the first metallic material in a second process chamber at a second temperature and at a first bias power to form a seed layer of the second metallic material; etching the seed layer in the second process chamber at a second bias power greater than the first bias power to form an intermix layer within the feature comprising the first metallic material and the second metallic material; and heating the substrate to a third temperature greater than the second temperature, causing a reflow of the second metallic material.

10 Claims, 5 Drawing Sheets

(56) References Cited

U.S. PATENT DOCUMENTS

| | | |
|---|---|---|
| 2013/0320505 A1 | 12/2013 | Emesh et al. |
| 2014/0327141 A1 | 11/2014 | Yu et al. |
| 2015/0221552 A1 | 8/2015 | Hamaguchi et al. |
| 2015/0332961 A1* | 11/2015 | Ishizaka .............. H01L 21/2855 438/653 |
| 2016/0276267 A1 | 9/2016 | Lee et al. |
| 2018/0211872 A1* | 7/2018 | Wu .................. H01L 21/76873 |
| 2019/0088540 A1 | 3/2019 | Hou et al. |

* cited by examiner

METHODS AND APPARATUS FOR INTERMIXING LAYER FOR ENHANCED METAL REFLOW

FIELD

Embodiments of the present disclosure generally relate to semiconductor processing of semiconductor substrates.

BACKGROUND

A semiconductor device such as an IC (integrated circuit) generally has electronic circuit elements such as transistors, diodes, and resistors fabricated integrally on a single body of semiconductor material such as a wafer or substrate. The various circuit elements are connected through conductive connectors to form a complete circuit which can contain millions of individual circuit elements. Interconnects provide the electrical connections between the various electronic elements of an integrated circuit and form the connections between the circuit elements and the device's external contact elements, such as pins, for connecting the integrated circuit to other circuits. The interconnects may be constructed throughout multiple layers and connected within/between layers by trenches/vias. As the push for smaller and smaller form factors continues, the interconnects must also be scaled down to enable the smaller form factors of semiconductor devices. Trenches/vias with 3 nm node structures and beyond pose challenges during formation due to the small sizes. Reflow processes are often used as a method to fill in the trenches/vias. The inventors have found, however, that conventional reflow processes may leave voids within the trenches/vias for smaller form factors of semiconductor devices.

Accordingly, the inventors have provided improved methods and apparatus for filling features on a substrate.

SUMMARY

Methods and apparatus for filling features on a substrate are provided herein. In some embodiments, a method of filling features on a substrate includes: depositing a first metallic material on the substrate and within a feature disposed in the substrate in a first process chamber via a chemical vapor deposition (CVD) process at a first temperature; depositing a second metallic material on the first metallic material in a second process chamber at a second temperature and at a first bias power to form a seed layer of the second metallic material; etching the seed layer in the second process chamber at a second bias power greater than the first bias power to form an intermix layer within the feature comprising the first metallic material and the second metallic material; and heating the substrate to a third temperature greater than the second temperature, causing a reflow of the second metallic material within the feature.

In some embodiments, a method of filling features on a substrate includes: depositing a first metallic material within a feature on the substrate in a first process chamber via a chemical vapor deposition (CVD) process at a first temperature; depositing a material comprising copper on the first metallic material in a second process chamber via a physical vapor deposition (PVD) process at a second temperature and at a first bias power to form a seed layer; etching the seed layer at a second bias power greater than the first bias power to form an intermix layer within the feature comprising the first metallic material and the material comprising copper; and heating the substrate to a third temperature higher than the second temperature to reflow the material comprising copper on the substrate.

In some embodiments, a non-transitory, computer readable medium having instructions stored thereon that, when executed, cause a method for filling features on a substrate to be performed, the method including: depositing a first metallic material on the substrate and within a feature disposed in the substrate in a first process chamber via a chemical vapor deposition (CVD) process at a first temperature; depositing a second metallic material on the first metallic material in a second process chamber at a second temperature and at a first bias power to form a seed layer of the second metallic material; etching the seed layer in the second process chamber at a second bias power greater than the first bias power to form an intermix layer within the feature comprising the first metallic material and the second metallic material; and heating the substrate to a third temperature greater than the second temperature, causing a reflow of the second metallic material within the feature.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
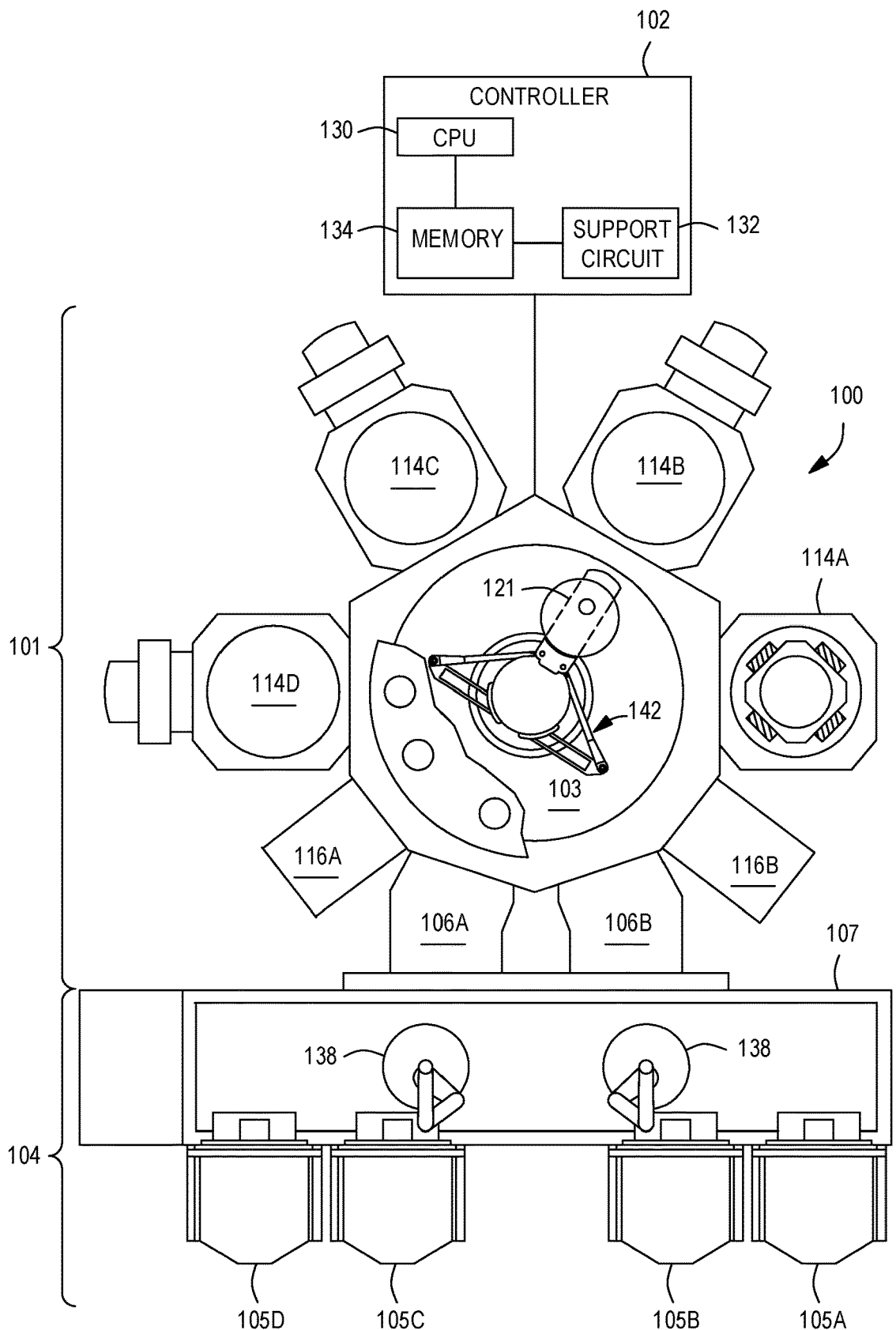
FIG. 1 depicts a multi-chamber processing tool suitable to perform methods for processing a substrate in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Interconnects for use in integrated circuits may be constructed throughout multiple layers and connected within/between layers by one or more features such as trenches or vias formed on a substrate. The methods and apparatus provided herein describe gap fill processes that utilize reflow of fill material to form the interconnects. The substrate typically includes multiple layers deposited within the one or more features of the substrate. For example, a liner layer comprising a first metallic material is deposited within the one or more features, followed by deposition of the fill material comprising a second metallic material. Deposition of the fill material via the methods provided herein advantageously forms an intermix layer comprising the first metallic material and the second metallic material within the one or more features.

After deposition of the fill material, the temperature of the substrate is raised to reflow the fill material. The inventors have observed that the intermix layer advantageously improves filling of the one or more features during the reflow process and reduces voids within the one or more features. The inventors have also observed that the liner layer deposited via a chemical vapor deposition (CVD) process advantageously forms a more amorphous atomic structure as compared to a physical vapor deposition (PVD) process, which promotes intermixing of the first metallic material and the second metallic material.

FIG. 1 depicts a multi-chamber processing tool 100 suitable to perform methods for processing a substrate in accordance with some embodiments of the present disclosure. Examples of the multi-chamber processing tool 100 include the CENTURA® and ENDURA® tools, all commercially available from Applied Materials, Inc., of Santa Clara, Calif. The methods described herein may be practiced using other multi-chamber processing tools having suitable process chambers coupled thereto, or in other suitable process chambers. For example, in some embodiments, the inventive methods discussed above may be advantageously performed in a multi-chamber processing tool such that there are limited or no vacuum breaks between processes. For example, reduced vacuum breaks may limit or prevent contamination of any substrates being processed in the multi-chamber processing tool. Other process chambers, including ones available from other manufacturers, may also be suitably used in connection with the teachings provided herein.

The multi-chamber processing tool 100 includes a processing platform 101 that is vacuum-tight, a factory interface 104, and a system controller 102. The processing platform 101 includes multiple processing chambers, such as 114A, 114B, 114C, and 114D, operatively coupled to a transfer chamber 103 that is under vacuum. The factory interface 104 is operatively coupled to the transfer chamber 103 by one or more load lock chambers, such as 106A and 106B shown in FIG. 1.

In some embodiments, the factory interface 104 comprises at least one docking station 107 and at least one factory interface robot 138 to facilitate the transfer of the substrates. The at least one docking station 107 is configured to accept one or more front opening unified pod (FOUP). Four FOUPS, identified as 105A, 105B, 105C, and 105D, are shown in FIG. 1. The at least one factory interface robot 138 is configured to transfer the substrates from the factory interface 104 to the processing platform 101 through the load lock chambers 106A, 106B. Each of the load lock chambers 106A and 106B have a first port coupled to the factory interface 104 and a second port coupled to the transfer chamber 103. In some embodiments, the load lock chambers 106A and 106B are coupled to one or more service chambers (e.g., service chambers 116A and 116B). The load lock chambers 106A and 106B are coupled to a pressure control system (not shown) which pumps down and vents the load lock chambers 106A and 106B to facilitate passing the substrates between the vacuum environment of the transfer chamber 103 and the substantially ambient (e.g., atmospheric) environment of the factory interface 104.

The transfer chamber 103 has a vacuum robot 142 disposed therein. The vacuum robot 142 is capable of transferring a substrate 121 between the load lock chamber 106A and 106B, the service chambers 116A and 116B, and the processing chambers 114A, 114B, 114C, and 114D. In some embodiments, the vacuum robot 142 includes one or more upper arms that are rotatable about a respective shoulder axis. In some embodiments, the one or more upper arms are coupled to respective forearm and wrist members such that the vacuum robot 142 can extend into and retract from any processing chambers coupled to the transfer chamber 103.

The processing chambers 114A, 114B, 114C, and 114D, are coupled to the transfer chamber 103. Each of the processing chambers 114A, 114B, 114C, and 114D may comprise a chemical vapor deposition (CVD) chamber, an atomic layer deposition (ALD) chamber, a physical vapor deposition (PVD) chamber, a plasma enhanced atomic layer deposition (PEALD) chamber, a preclean/annealing chamber, or the like. For example, processing chamber 114A is a CVD chamber. In some embodiments, processing chamber 114A is a Volta™ CVD process chamber, commercially available from Applied Materials, Inc., of Santa Clara, Calif.

Other types of processing chambers can also be used where substrate process results are found to be dependent upon chamber component surface texturing as taught herein.

The system controller 102 controls the operation of the multi-chamber processing tool 100 using a direct control of the service chambers 116A and 116B and the process chambers 114A, 114B, 114C, and 114D or alternatively, by controlling the computers (or controllers) associated with the service chambers 116A and 116B and the process chambers 114A, 114B, 114C, and 114D. The system controller 102 generally includes a central processing unit (CPU) 130, a memory 134, and a support circuit 132. The CPU 130 may be one of any form of a general-purpose computer processor that can be used in an industrial setting. The support circuit 132 is conventionally coupled to the CPU 130 and may comprise a cache, clock circuits, input/output subsystems, power supplies, and the like. Software routines, such as processing methods as described above may be stored in the memory 134 and, when executed by the CPU 130, transform the CPU 130 into a system controller 102. The software routines may also be stored and/or executed by a second controller (not shown) that is located remotely from the multi-chamber processing tool 100.

In operation, the system controller 102 enables data collection and feedback from the respective chambers and systems to optimize performance of the multi-chamber processing tool 100 and provides instructions to system components. For example, the memory 134 can be a non-transitory computer readable storage medium having instructions that when executed by the CPU 130 (or system controller 102) perform the methods described herein.

Figure 2:
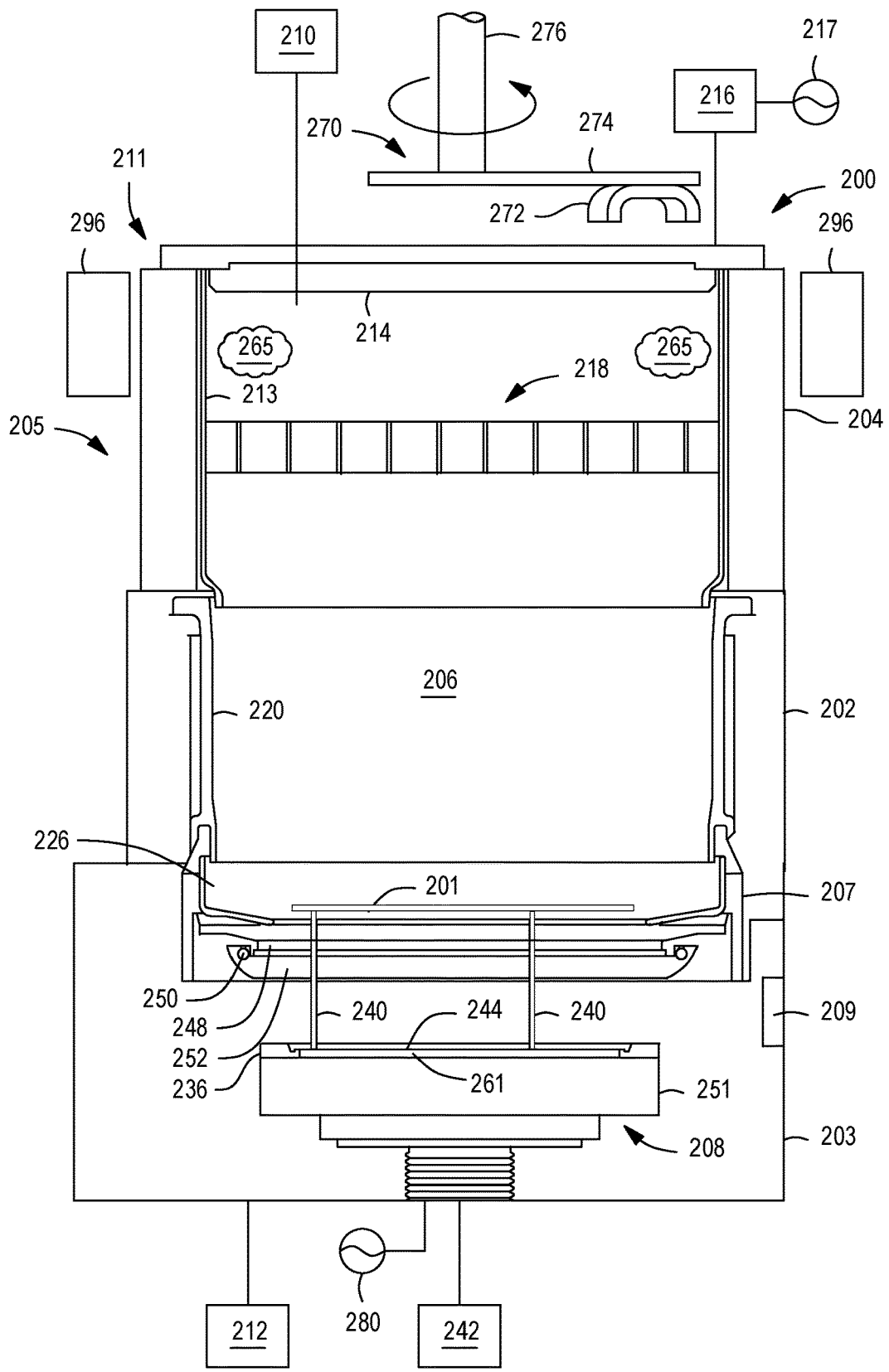
FIG. 2 depicts a process chamber for depositing and etching a second metallic material in accordance with some embodiments of the present disclosure.

FIG. 2 depicts a process chamber 200 for depositing and etching a second metallic material in accordance with some embodiments of the present disclosure. The process chamber 200 is illustratively described herein with respect to a physical vapor deposition (PVD) chamber. However, the methods and apparatus of the present principles may be used in other process chambers as well. The process chamber 200 may be one of processing chambers 114A, 114B, 114C, and 114D. In some embodiments, the process chamber 200 further includes a collimator 218 disposed therein. The process chamber 200 generally includes an upper sidewall 202, a lower sidewall 203, a ground adapter 204, and a lid assembly 211 defining a body 205 that encloses an interior volume 206. The interior volume 206 includes a central portion having approximately the given diameter of the substrate to be processed and a peripheral portion surrounding the central portion. In addition, the interior volume 206 includes an annular region above the substrate and proximate a target, wherein an inner diameter of the annular region is substantially equal to or greater than a diameter of the substrate such that a predominant portion of the plasma is disposed in a position both above and radially outward of the substrate.

An adapter plate 207 may be disposed between the upper sidewall 202 and the lower sidewall 203. A substrate support 208 is disposed in the interior volume 206 of the process chamber 200. The substrate support 208 may include, for example, an electrostatic chuck (ESC) 251 with a puck 261. The substrate support 208 is configured to support a substrate having a given diameter (e.g., 150 mm, 200 mm, 300 mm, 450 mm, or the like). A substrate transfer port 209 is formed in the lower sidewall 203 for transferring substrates into and out of the interior volume 206. In some embodiments, the process chamber 200 is configured to deposit the second metallic material, for example, copper, cobalt, or aluminum, on a substrate 201. The substrate 201 may be substrate 121 depicted in FIG. 1.

A gas source 210 is coupled to the process chamber 200 to supply process gases into the interior volume 206. In some embodiments, process gases may include inert gases, non-reactive gases, and reactive gases, if necessary. Examples of process gases that may be provided by the gas source 210 include, but not limited to, argon (Ar), helium (He), neon (Ne), nitrogen ($N_2$), oxygen ($O_2$), and water ($H_2O$) vapor among others. A pumping device 212 is coupled to the process chamber 200 in communication with the interior volume 206 to control the pressure of the interior volume 206. In some embodiments, the pumping device 212 may also be used to remove backside gases from the substrate 201 in order to minimize cooling down of the substrate 201. In some embodiments, during deposition the pressure level of the process chamber 200 may be maintained at approximately 1 Torr or less. In some embodiments, the pressure level of the process chamber 200 may be maintained at approximately 500 mTorr or less during deposition.

The ground adapter 204 may support a target, such as target 214. The target 214 is fabricated from a material to be deposited on the substrate. The target 214 may be coupled to a source assembly comprising a power supply 217 for the target 214. In some embodiments, the power supply 217 may be an RF power supply, which may be coupled to the target 214 via a match network 216. In some embodiments, the power supply 217 may alternatively be a DC power supply, in which case the match network 216 is omitted. In some embodiments, the power supply 217 may include both DC and RF power sources.

A magnetron 270 is positioned above the target 214. The magnetron 270 may include a plurality of magnets 272 supported by a base plate 274 connected to a shaft 276, which may be axially aligned with the central axis of the process chamber 200 and the substrate 201. The magnets 272 produce a magnetic field within the process chamber 200 near the front face of the target 214 to generate plasma so a significant flux of ions strike the target 214, causing sputter emission of target material. The magnets 272 may be rotated about the shaft 276 to increase uniformity of the magnetic field across the surface of the target 214. The magnets 272 are rotated about the central axis of the process chamber 200 within an annular region extending between about the outer diameter of the substrate to about the outer diameter of the interior volume 206. In general, magnets 272 may be rotated such that the innermost magnet position during rotation of the magnets 272 is disposed above or outside of the diameter of the substrate being processed (e.g., the distance from the axis of rotation to the innermost position of the magnets 272 is equal to or greater than the diameter of the substrate being processed).

The process chamber 200 further includes an upper shield 213 and a lower shield 220, or a one-piece shield. A collimator 218 is positioned in the interior volume 206 between the target 214 and the substrate support 108. In some embodiments, the collimator 218 may be electrically biased to control ion flux to the substrate and neutral angular distribution at the substrate, as well as to increase the deposition rate due to the added DC bias. Electrically biasing the collimator results in reduced ion loss to the collimator, advantageously providing greater ion/neutral ratios at the substrate. A collimator power source (not shown) is coupled to the collimator 218 to facilitate biasing of the collimator 218. In some embodiments, the collimator 218 may be electrically isolated from grounded chamber components such as the ground adapter 204. For example, as depicted in FIG. 2, the collimator 218 is coupled to the upper shield 213.

In some embodiments, a set of magnets 296 may be disposed adjacent to the ground adapter 204 to assist with generating the magnetic field to guide dislodged ions from the target 214. The magnetic field formed by the set of magnets 196 may alternatively or in combination prevent ions from hitting the sidewalls of the chamber (or sidewalls of the upper shield 213) and direct the ions vertically through the collimator 218. For example, the set of magnets 296 are configured to form a magnetic field having substantially vertical magnetic field lines in the peripheral portion. The substantially vertical magnetic field lines advantageously guide ions through the interior volume. The set of magnets 296 may be stationary or moveable to adjust the position of the set of magnets 296 in a direction parallel to a central axis of the process chamber 200.

An RF power source 280 may be coupled to the process chamber 200 through the substrate support 208 to provide a bias power to the substrate support 208. Any bias power described herein is provided in connection with processing an exemplary 300 mm substrate and may scale according to the diameter or size of the substrate 201 (i.e., for larger or smaller substrates). For example, the RF power source 280, may provide a bias power of greater than zero watts to approximately 1000 watts of bias power for the substrate 201 having a diameter of 300 mm. In some embodiments, the RF power source 280 may have a frequency between approximately 2 MHz and approximately 200 MHz, such as approximately 13.56 MHz. In operation, the magnets 272 are rotated to form a plasma 265 in the annular portion of the interior volume 206 to sputter the target 214. The plasma 265 may be formed above the collimator 218, when the collimator 218 is present to sputter the target 214 above the collimator 218. A radius of rotation of the magnets 272 is greater than a radius of the substrate 201 to ensure that little to no sputtered material exists above the substrate 201.

The collimator 218 is positively biased so that the second metallic material is forced through the collimator 218. Moreover, most, if not all, of the neutral sputtered material traveling toward the central region of the collimator 218 will likely collide with and stick to the collimator walls. Because the directionality of the metallic neutrals cannot be changed, most, if not all, of the metallic neutrals are advantageously not deposited on the substrate 201. To ensure that the trajectory of the sputtered metallic ions has enough space to be changed, the collimator 218 is disposed at a predetermined height above the substrate support 208

In some embodiments, the lower shield 220 may be provided in proximity to the collimator 218 and interior of the ground adapter 204 or the upper sidewall 202. The collimator 218 includes a plurality of apertures to direct gas and/or material flux within the interior volume 206. The collimator 218 may be coupled to the collimator power source via the process tool adapter 238. A shield ring 226 may be disposed in the process chamber 200 adjacent to the lower shield 220 and intermediate of the lower shield 220 and the adapter plate 207. The substrate 201 (shown supported on lift pins 240 in a raised heating or reflow position) is centered relative to the longitudinal axis of the substrate support 208 by coordinated positioning calibration between the substrate support 208 and a robot blade (not shown). Thus, the substrate 201 may be centered within the process chamber 200 and the shield ring 226 may be centered radially about the substrate 201 during processing.

In operation, a robot blade of the vacuum robot 142 having the substrate 201 disposed thereon is extended through the substrate transfer port 209. The substrate support 208 may be lowered to allow the substrate 201 to be transferred to the lift pins 140 extending from the substrate support 208. Lifting and lowering of the substrate support 208 may be controlled by a drive 242 coupled to the substrate support 208. The substrate support 208 may be lowered as the lift pins 240 are raised to reach a heating or reflow position. Similarly, the substrate 201 may be lowered onto a substrate receiving surface 244 of the substrate support 208 by lowering the lift pins 240 and raising the substrate support 208 to an etch or deposition position. With the substrate 201 positioned on the substrate receiving surface 244 of the substrate support 208, sputter deposition or an etch process may be performed on the substrate 201.

During a deposition process, material is sputtered from the target 214 and deposited on the surface of the substrate 201. The target 214 and the substrate support 208 are biased relative to each other by the power supply 217 or the RF power source 280 to maintain a plasma formed from the process gases supplied by the gas source 210. The ions from the plasma are accelerated toward and strike the target 214, causing target material to be dislodged from the target 214. The dislodged target material and process gases form a layer on the substrate 201 with desired compositions. A deposition ring 236 may be disposed about the substrate support 208 to reduce or prevent unwanted deposits and may be electrically insulated from the substrate 201 during processing.

After a sputter deposition or etch process of the fill material, the substrate 201 may be elevated utilizing the lift pins 240 to a position that is spaced away from the substrate support 208. The elevated location may be above one or both of the shield ring 226 and a reflector ring 248 adjacent to the adapter plate 207. The adapter plate 207 includes one or more lamps 250 coupled to the adapter plate 207 at a position intermediate of a lower surface of the reflector ring 248 and a concave portion 252 of the adapter plate 207. The lamps 250 provide optical and/or radiant energy in the visible or near visible wavelengths, such as in the infrared (IR) and/or ultraviolet (UV) spectrum. The energy from the lamps 250 is focused radially inward toward the backside (i.e., lower surface) of the substrate 201 to heat the substrate 201 and the material deposited thereon to perform a reflow process. Reflective surfaces on the chamber components surrounding the substrate 201 serve to focus the energy toward the backside of the substrate 201 and away from other chamber components where the energy would be lost and/or not utilized. After controlling the substrate 201 to a third temperature, the substrate 201 is lowered to a position on the substrate receiving surface 244 of the substrate support 108. The substrate 201 may be removed from the process chamber 200 through the substrate transfer port 209 for further processing.

Figure 3:
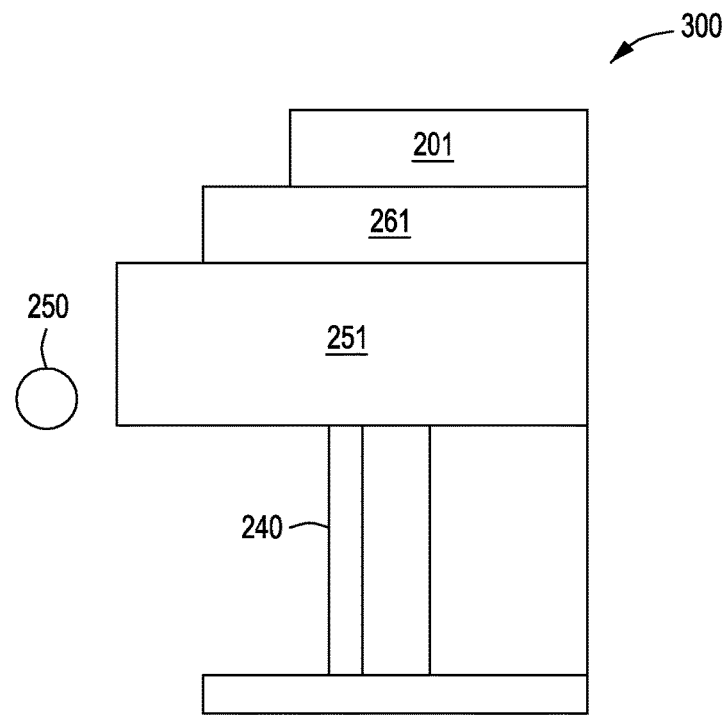
FIG. 3 depicts a schematic side view of a portion of the substrate support of the process chamber of FIG. 2 in a deposition or etch position in accordance with some embodiments of the present disclosure.
Figure 4:
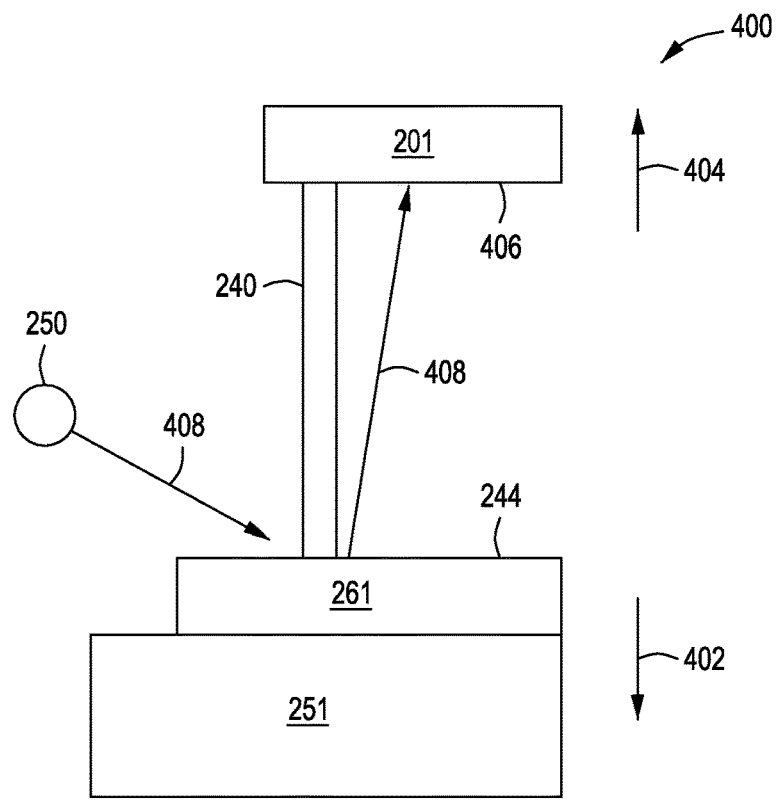
FIG. 4 depicts a schematic side view of a portion of the substrate support of the process chamber of FIG. 2 in a heating or reflow position in accordance with some embodiments of the present disclosure.

FIG. 3 depicts a cross-sectional view 300 of a portion of the substrate support 208 of the process chamber 200 including ESC 251 and the lamp 250 in a deposition or etch position (the substrate 201 is in a lowered position, not shown in FIG. 2). The lamp 250 radiates infrared or ultraviolet heat when the lamp 250 is operational. The substrate 201 is supported by the puck 261 which interfaces with the ESC 251. The lift pins 240 enable lifting of the substrate 201 off of the substrate receiving surface 244 of the puck 261 when the substrate 201 is in a heating or reflow position. In FIG. 4, a cross-sectional view 400 depicts the substrate 201 and the substrate support 208 in the heating or reflow position (the substrate 201 is in a raised position, as shown in FIG. 2). In the reflow position, the substrate support 208 may be lowered 402 as the lift pin 240 raises 404 the substrate 201, leaving a lower surface 406 of the substrate 201 exposed to heat radiation 408 from the lamp 250.

Figure 5:
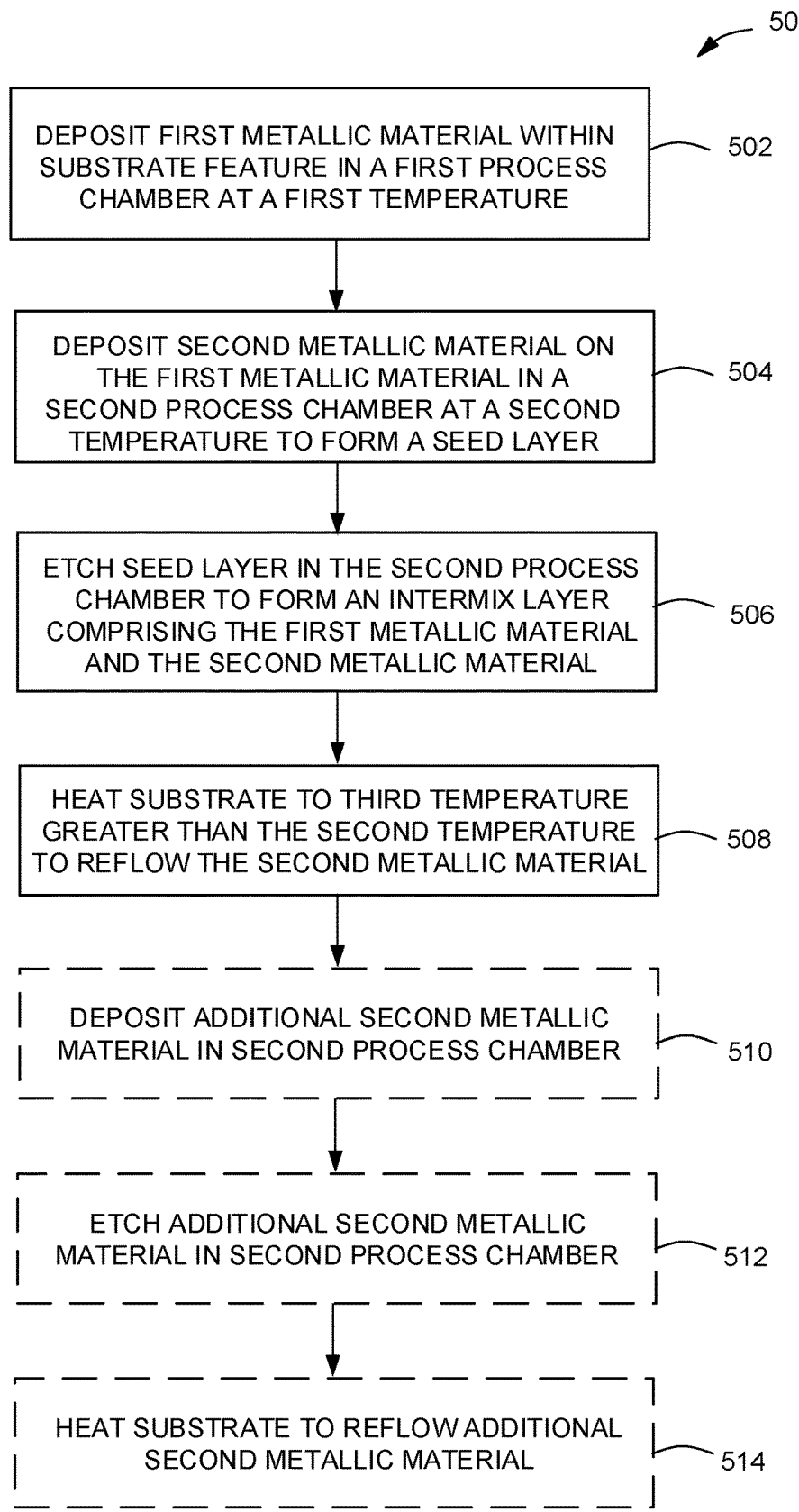
FIG. 5 depicts a method 500 of filling features on a substrate in accordance with some embodiments of the present disclosure.
Figure 6A:
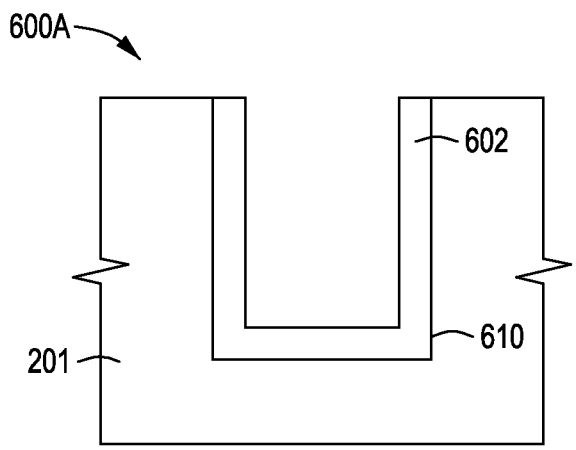
FIG. 6A depicts a schematic cross-sectional view of a portion of a substrate having a feature and a barrier layer disposed in the feature in accordance with some embodiments of the present disclosure.

FIG. 5 depicts a method 500 of filling features on a substrate. The method 500 may be performed with any suitable multi-chamber processing tool (e.g., multi-chamber processing tool 100). At 502, a first metallic material is deposited within a feature on a substrate (e.g., substrate 201) to form a liner layer. In at least some embodiments, the feature can be a trench, a via, or the like. The liner layer advantageously improves bond quality of the subsequently deposited fill material and reduces electromagnetic failures. FIG. 6A depicts a schematic cross-sectional view 600A of a portion of the substrate 201 prior to depositing the first metallic material. FIG. 6A depicts the substrate 201 having a feature 610 and a barrier layer 602 disposed in the feature 610. The substrate 201 generally comprises a dielectric material, for example, silicon-containing materials, such as silicon oxide, and its derivatives such as fluorine-doped silicon dioxide (FSG), carbon-doped oxide (SiCOH), porous carbon-doped oxide (SiCOH), or the like. The barrier layer 602, when used, prevents metal diffusion of the first metallic material into the dielectric material of the substrate 201. In some embodiments, the barrier layer 602 is made of metal or metal nitride and may be deposited onto the substrate 201 via a suitable deposition process, for example via a PVD process, a CVD process, or the like.

Figure 6B:
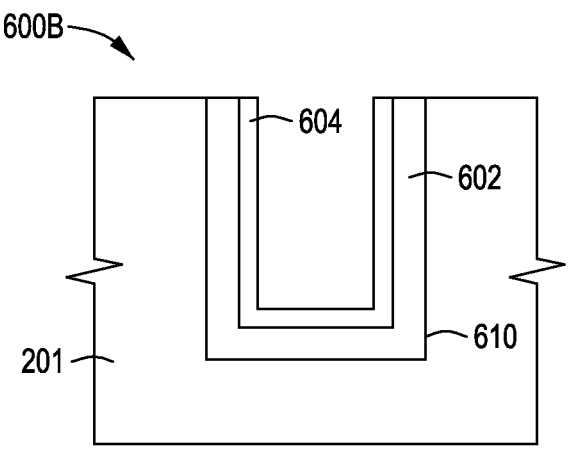
FIG. 6B depicts a schematic cross-sectional view of a portion of a substrate with a first metallic material deposited within a feature to form a liner layer in accordance with some embodiments of the present disclosure.

FIG. 6B depicts a schematic cross-sectional view 600B of a portion of the substrate 201 with a first metallic material deposited within a feature 610 to form a liner layer 604. The first metallic material is deposited in a first process chamber (e.g., processing chamber 114A) via a CVD process at a first temperature. In some embodiments, the first metallic material is deposited without bias power. The first metallic material may be deposited with or without plasma. In some embodiments, the first metallic material is cobalt, tungsten, aluminum, silver, ruthenium, rhodium, iridium, or tantalum. In some embodiments, the first temperature is about 150 to about 250 degrees Celsius. In some embodiments, a thickness of the first metallic material (i.e., thickness of liner layer) that is deposited is less than 35 angstroms. In some embodiments, the first metallic material is deposited to a thickness of about 14 and about 30 angstroms.

At 504, a second metallic material, or fill material, is deposited on the first metallic material in a second process chamber (e.g., one of processing chambers 114C, 114C, 114D) at a second temperature and at a first bias power to form a seed layer of the second metallic material. In some embodiments, the second metallic material is deposited via a PVD process. In some embodiments, the second metallic material comprises copper, cobalt, or aluminum. In some embodiments, the substrate is positioned to a deposition position (e.g., as depicted in FIG. 3) within the second process chamber prior to depositing the second metallic material on the substrate. In some embodiments, the first process chamber and the second process chamber are part of a multi-chamber processing tool (e.g. multi-chamber processing tool 100), wherein each of the first process chamber and the second process chamber are operatively coupled to a vacuum transfer chamber.

Figure 6C:
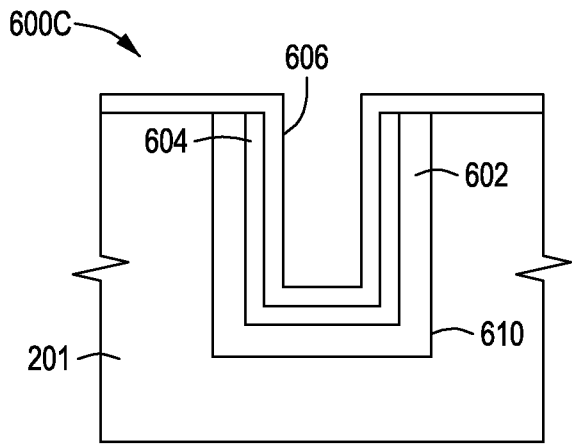
FIG. 6C depicts a schematic cross-sectional view of a portion of a substrate with a seed layer of a second metallic material deposited within a feature in accordance with some embodiments of the present disclosure.

FIG. 6C depicts a schematic cross-sectional view 600C of a portion of the substrate 201 with a seed layer 606 of a second metallic material deposited within the feature 610. In some embodiments, the second temperature is about 15 to about 350 degrees Celsius. In some embodiments, the second temperature is about 15 to about 35 degrees Celsius. In some embodiments, the first bias power is about 5 watts to about 120 watts for a substrate having a diameter of 300 mm. The first bias power may scale according to a diameter or size of the substrate 201.

Figure 6D:
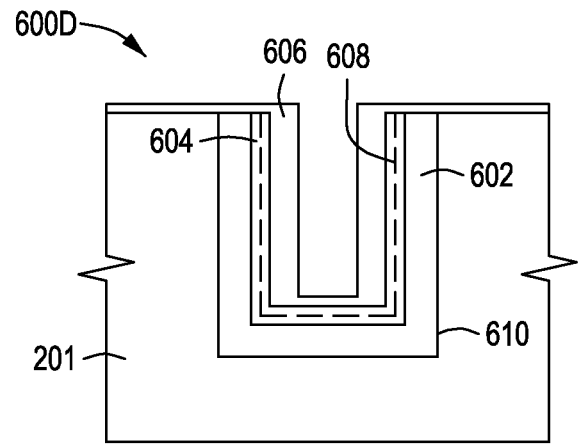
FIG. 6D depicts a schematic cross-sectional view of a portion of a substrate after a seed layer of a second metallic material is etched in accordance with some embodiments of the present disclosure.

At 506, a portion of the seed layer (e.g., seed layer 606) is etched via physical bombardment from metal ions in the second process chamber at a second bias power greater than the first bias power to form an intermix layer within the feature comprising the first metallic material and the second metallic material and disposed between the liner layer 604 and the seed layer 606. In some embodiments, the physical bombardment is from metal ions comprising the second metallic material. In some embodiments, the second bias power is about 120 watts to about 1000 watts for a substrate having a diameter of 300 mm. The second bias power may scale according to a diameter or size of the substrate. In some embodiments, the first bias power and the second bias power have a frequency of about 2 MHz to about 200 MHz. During the etch process, high energy ions of the second metallic material bombard the seed layer 606, pushing particles of the second metallic material into interstitial voids of the liner layer 604 to form the intermix layer. During the etch process, high energy ions of the second metallic material also bombard a bottom of the seed layer 606, advantageously removing particles of the second metallic material from the bottom of the seed layer 606 and re-depositing the removed particles onto sidewalls of the seed layer 606, which aids in any subsequent reflow processes. FIG. 6D depicts a schematic cross-sectional view 600D of a portion of the substrate 201 after the seed layer 606 is etched. The intermix layer 608 is disposed between the liner layer 604 and the seed layer 606.

Figure 6E:
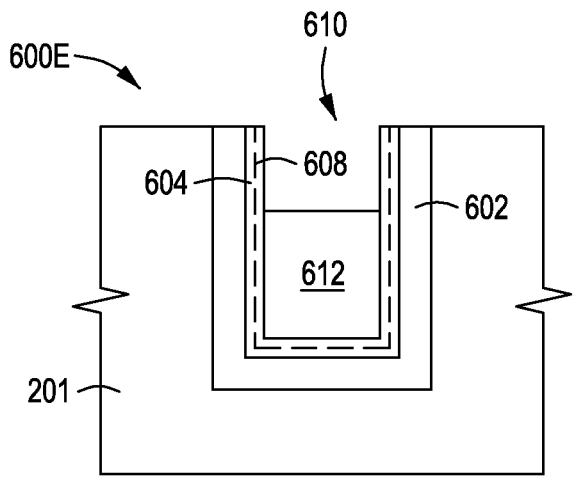
FIG. 6E depicts a schematic cross-sectional view of a portion of a substrate having a reflowed second metallic material in accordance with some embodiments of the present disclosure.

At 508, the substrate is heated to a third temperature greater than the second temperature to reflow at least some of a remaining portion of the second metallic material to at least partially fill the feature. The inventors have observed better reflow behavior (i.e., reduced or no voids in feature) of the second metallic material when the second metallic material is disposed on the intermix layer 208 as compared to when the second metallic material is on the liner layer 604 with no intermix layer 608 therebetween. The third temperature should be sufficient enough to maintain the mobility of the second metallic material. In some embodiments, the third temperature is between about 100 degrees and about 400 degrees Celsius. In some embodiments, the substrate is positioned to a raised heating position, above the deposition position, prior to heating the substrate. FIG. 6E depicts a schematic cross-sectional view 600E of a portion of the substrate 201 having a reflowed second metallic material 612.

Figure 6F:
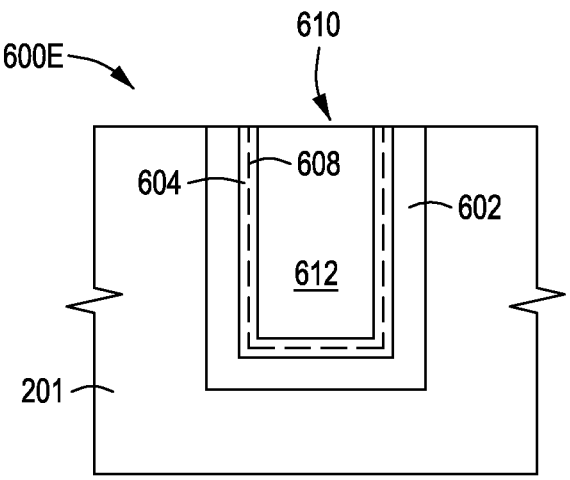
FIG. 6F depicts a schematic cross-sectional view of a portion of a substrate having a feature completely filled with fill material.

Optionally, at 510, additional second metallic material may be deposited within the feature (e.g., feature 610) in the second process chamber. In some embodiments, the additional second metallic material may be deposited at the second temperature. Optionally, at 512, the additional second metallic material is etched in the second process chamber. The additional etching process may intermix particles of the additional second metallic material into the intermix layer 608. Optionally, at 514, the substrate is heated to reflow the additional second metallic material in the feature 610. In some embodiments, 510 and 514 may be repeated, with or without the repeated etching at 512, until the feature 610 is completely filled with the fill material (i.e., reflowed second metallic material 612) without any voids or gaps within the feature 610 as depicted in FIG. 6F.

While the foregoing is directed to embodiments of the present disclosure, other and further embodiments of the disclosure may be devised without departing from the basic scope thereof.

The invention claimed is:

1. A method of filling features on a substrate, comprising:
depositing a first metallic material on the substrate and within a feature disposed in the substrate in a first process chamber via a chemical vapor deposition (CVD) process at a first temperature;
depositing a second metallic material on the first metallic material in a second process chamber at a second temperature and at a first bias power to form a seed layer of the second metallic material;
etching a portion of the seed layer in the second process chamber at a second bias power greater than the first bias power to form an intermix layer within the feature comprising the first metallic material and the second metallic material;
heating the substrate to a third temperature greater than the second temperature to reflow at least some of a remaining portion of the second metallic material to at least partially fill the feature; and at least one of:

depositing additional second metallic material on the seed layer in the second process chamber at the second temperature, and heating the substrate to the third temperature after depositing the additional second metallic material to reflow the additional second metallic material, or positioning the substrate at a deposition position prior to depositing the second metallic material on the substrate, and positioning the substrate to a raised heating position, above the deposition position, prior to heating the substrate.

2. The method of claim 1, wherein the first bias power and the second bias power have a frequency of about 2 MHz to about 200 MHz.

3. The method of claim 1, wherein at least one of:
the first bias power is about 5 watts to about 120 watts; and
the second bias power is about 120 watts to about 1000 watts.

4. The method of claim 1, wherein at least one of:
the first temperature is about 150 to about 250 degrees Celsius;
the second temperature is about 20 to about 350 degrees Celsius; and
the third temperature is between about 100 degrees and about 400 degrees Celsius.

5. The method of claim 1, wherein the second metallic material is deposited in a physical vapor deposition (PVD) chamber.

6. The method of claim 1, wherein at least one of:
the second metallic material comprises copper, cobalt, or aluminum; or
the first metallic material is cobalt, tungsten, aluminum, silver, ruthenium, rhodium, iridium, or tantalum.

7. The method of claim 1, wherein the first process chamber and the second process chamber are part of a multi-chamber processing tool, wherein each of the first process chamber and the second process chamber are operatively coupled to a vacuum transfer chamber, and wherein depositing the first metallic material and depositing the second metallic material are performed without a vacuum break.

8. A method of filling features on a substrate, comprising:
depositing a first metallic material within a feature on the substrate in a first process chamber via a chemical vapor deposition (CVD) process at a first temperature;
depositing a material comprising copper on the first metallic material in a second process chamber via a physical vapor deposition (PVD) process at a second temperature and at a first bias power to form a seed layer;
etching the seed layer at a second bias power greater than the first bias power to form an intermix layer within the feature comprising the first metallic material and the material comprising copper;
heating the substrate to a third temperature higher than the second temperature to reflow the material comprising copper on the substrate;
depositing additional material comprising copper on the intermix layer; and
heating the substrate to the third temperature after depositing the additional material comprising copper to reflow the additional material comprising copper.

9. The method of claim 8, wherein a thickness of the first metallic material that is deposited is less than 30 angstroms.

10. The method of claim 8, wherein the first metallic material is cobalt, tungsten, aluminum, silver, ruthenium, rhodium, iridium, or tantalum.

* * * * *